United States Patent
Kiyota et al.

(10) Patent No.: US 10,253,933 B2
(45) Date of Patent: Apr. 9, 2019

(54) LIGHT EMITTING DEVICE

(71) Applicant: NICHIA CORPORATION, Anan-shi, Tokushima (JP)

(72) Inventors: Seiji Kiyota, Itano-gun (JP); Eiichiro Okahisa, Tokushima (JP)

(73) Assignee: NICHIA CORPORATION, Anan-Shi (JP)

(*) Notice: Subject to any disclaimer, the term of this patent is extended or adjusted under 35 U.S.C. 154(b) by 0 days.

(21) Appl. No.: 15/690,038

(22) Filed: Aug. 29, 2017

(65) Prior Publication Data

US 2018/0058645 A1 Mar. 1, 2018

(30) Foreign Application Priority Data

Aug. 30, 2016 (JP) ................... 2016-167457

(51) Int. Cl.
*F21K 9/64* (2016.01)
*G02B 19/00* (2006.01)
(Continued)

(52) U.S. Cl.
CPC ............... *F21K 9/64* (2016.08); *F21V 5/008* (2013.01); *F21V 9/30* (2018.02); *F21V 11/08* (2013.01);
(Continued)

(58) Field of Classification Search
CPC .. F21K 9/64; F21S 41/14; F21S 43/26; F21V 9/30; F21V 9/16; F21V 5/008;
(Continued)

(56) References Cited

U.S. PATENT DOCUMENTS 8,897,327 B2 * 11/2014 Auen .................... H01S 5/024
372/103
2009/0092168 A1 4/2009 Yamauchi et al.
(Continued)

FOREIGN PATENT DOCUMENTS

DE 10 2008 063 634 A1 6/2010
DE 102012201307 A1 * 8/2013 ......... H01S 5/02248
(Continued)

OTHER PUBLICATIONS

Extended European Search Report dated Jan. 22, 2018 in corresponding application No. 17188157.6.

*Primary Examiner* — Laura Gudorf
(74) *Attorney, Agent, or Firm* — Foley & Lardner LLP

(57) ABSTRACT

A light emitting device includes: a base; a laser element disposed on an upper face of the base and adapted to laterally emit a laser beam; a phosphor member disposed on the upper face of the base; a first optical member disposed on the upper face of the base, the first optical member comprising an entry-side lateral face through which the laser beam enters during use and an exit-side lateral face through which the laser beam exits during use, and the first optical member being configured to change a traveling direction of the laser beam such that the laser beam transmitted through the first optical member irradiates an upper face of the phosphor member; and a cap comprising: a light shielding member, and a light transmissive member located over the through hole, the laser element, the phosphor member, and the first optical member. The light shielding member includes a protruded portion extending downward to a position that is lower than an upper end of the first optical member so as to face the exit-side lateral face of the first optical member.

6 Claims, 7 Drawing Sheets

(51) Int. Cl.
| | |
|---|---|
| *F21V 11/08* | (2006.01) |
| *H01S 5/00* | (2006.01) |
| *F21V 9/30* | (2018.01) |
| *F21S 41/20* | (2018.01) |
| *F21V 5/00* | (2018.01) |
| *F21V 31/00* | (2006.01) |
| *F21Y 115/30* | (2016.01) |
| *H01S 5/022* | (2006.01) |
| *H01S 5/323* | (2006.01) |
| *F21V 5/02* | (2006.01) |
| *F21S 41/43* | (2018.01) |
| *F21S 41/16* | (2018.01) |
| *F21S 41/176* | (2018.01) |

(52) U.S. Cl.
CPC ........ *F21V 31/005* (2013.01); *G02B 19/0052* (2013.01); *H01S 5/005* (2013.01); *F21S 41/16* (2018.01); *F21S 41/176* (2018.01); *F21S 41/285* (2018.01); *F21S 41/43* (2018.01); *F21V 5/02* (2013.01); *F21Y 2115/30* (2016.08); *H01S 5/0071* (2013.01); *H01S 5/0222* (2013.01); *H01S 5/0224* (2013.01); *H01S 5/02216* (2013.01); *H01S 5/02292* (2013.01); *H01S 5/02296* (2013.01); *H01S 5/32341* (2013.01)

(58) Field of Classification Search
CPC ...... F21V 31/005; H01S 5/005; H01S 5/0071; H01S 5/02216; H01S 5/0222; H01S 5/0224; H01S 5/02292; H01S 5/02296; H01S 5/32341; F21Y 2115/30
See application file for complete search history.

(56) References Cited

U.S. PATENT DOCUMENTS

| | | | |
|---|---|---|---|
| 2009/0140416 | A1 | 6/2009 | Ishida et al. |
| 2010/0246159 | A1 | 9/2010 | Wada |
| 2012/0039072 | A1 | 2/2012 | Lell et al. |
| 2013/0329397 | A1* | 12/2013 | Shimizu ................ F21V 29/20 362/84 |
| 2014/0197528 | A1 | 7/2014 | Nagata |
| 2017/0016586 | A1* | 1/2017 | Tsuda .................. F21S 48/1145 |

FOREIGN PATENT DOCUMENTS

| | | |
|---|---|---|
| DE | 10 2014 226 336 A1 | 6/2016 |
| JP | 2005-217025 A | 8/2005 |
| JP | 2005-093885 A | 4/2007 |
| JP | 2009-094179 A | 4/2009 |
| JP | 2009-135235 A | 6/2009 |
| JP | 2010-251686 A | 11/2010 |
| JP | 2011-114228 A | 6/2011 |
| WO | WO-2013/027669 A1 | 2/2013 |
| WO | WO-2016/035645 A1 | 3/2016 |

\* cited by examiner

LIGHT EMITTING DEVICE

CROSS-REFERENCE TO RELATED APPLICATION

This application claims priority to Japanese Patent Application No. 2016-167457, filed on Aug. 30, 2016, the disclosure of which is hereby incorporated by reference in its entirety.

BACKGROUND

The present disclosure relates to a light emitting device.

There is known a light emitting device including a laser element and a phosphor member on a base which allows a laser beam to enter the phosphor member, thereby emitting light from the upper face of the phosphor member. See, for example, Japanese Patent Publication No. 2010-251686. This light emitting device includes a package which has a window above the base, and the light re-emitted from the upper face of the phosphor member is extracted from the window.

The light emitting device disclosed in the foregoing patent document has poor light extraction efficiency because a laser beam enters a lateral face of the phosphor member, and light is extracted from the upper face of the phosphor member. In other words, the use of light is reduced because light is absorbed or scattered inside the phosphor member during a duration from the time that a laser beam enters a lateral face of the phosphor member to the time that light exits the upper face of the phosphor member.

A conceivable construction for allowing a laser beam to enter the upper face of the phosphor member and extracting light from the same face includes, for example, an optical member such as a prism disposed between the laser element and the phosphor member in such a manner as to change the laser beam's traveling direction towards the upper face of the phosphor member using the optical member. In this case, however, there is a possibility of allowing a portion of the laser beam entering the optical member to travel directly towards the window as stray light; thus, there is room for improvement from the safety standpoint.

SUMMARY

An object of certain embodiments of the present disclosure is to provide a light emitting device capable of operating at a high level of safety.

The light emitting device according to one embodiment of the present disclosure comprises: a base; a laser element disposed on an upper face of the base and laterally emitting a laser beam; a phosphor member disposed on the upper face of the base and emits fluorescent light when irradiated with the laser beam; a first optical member disposed on the upper face of the base, including an entry-side lateral face through which the laser beam enters and an exit-side lateral face through which the laser beam exits, and changing the laser beam's traveling direction in such a manner as to allow the laser beam transmitting through the first optical member to irradiate the upper face of the phosphor member; and a cap including a light shielding member provided with a through hole penetrating therethrough in an up/down direction positioned above the phosphor member, and a light transmissive member closing the through hole, and covering the laser element, the phosphor member, and the first optical member. The light shielding member includes a protruded portion extending downward to a position that is lower than an upper end of the first optical member in such a manner as to face the exit-side lateral face of the first optical member.

The light emitting device according to the certain embodiments of the present invention can operate at a high level of safety.

DETAILED DESCRIPTION

Figure 1:
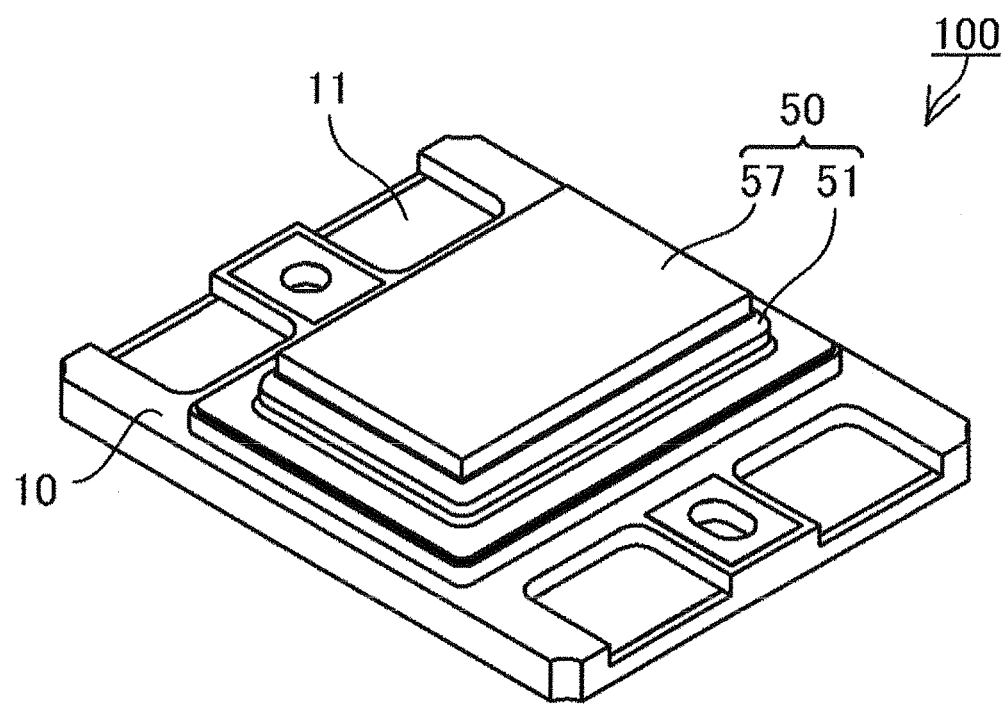
FIG. 1 is a schematic perspective view of the light emitting device according to one embodiment of the invention.

Certain embodiments of the present invention will be explained below with reference to the accompanying drawings. The embodiments described below, however, are for giving shape to the technical ideas of the present invention. Unless specifically stated, the present invention is not limited to those described below. The sizes, and/or positional relationship or the like of the components shown in the drawings might be exaggerated for clarity of explanation.

Embodiment 1

Figure 2:
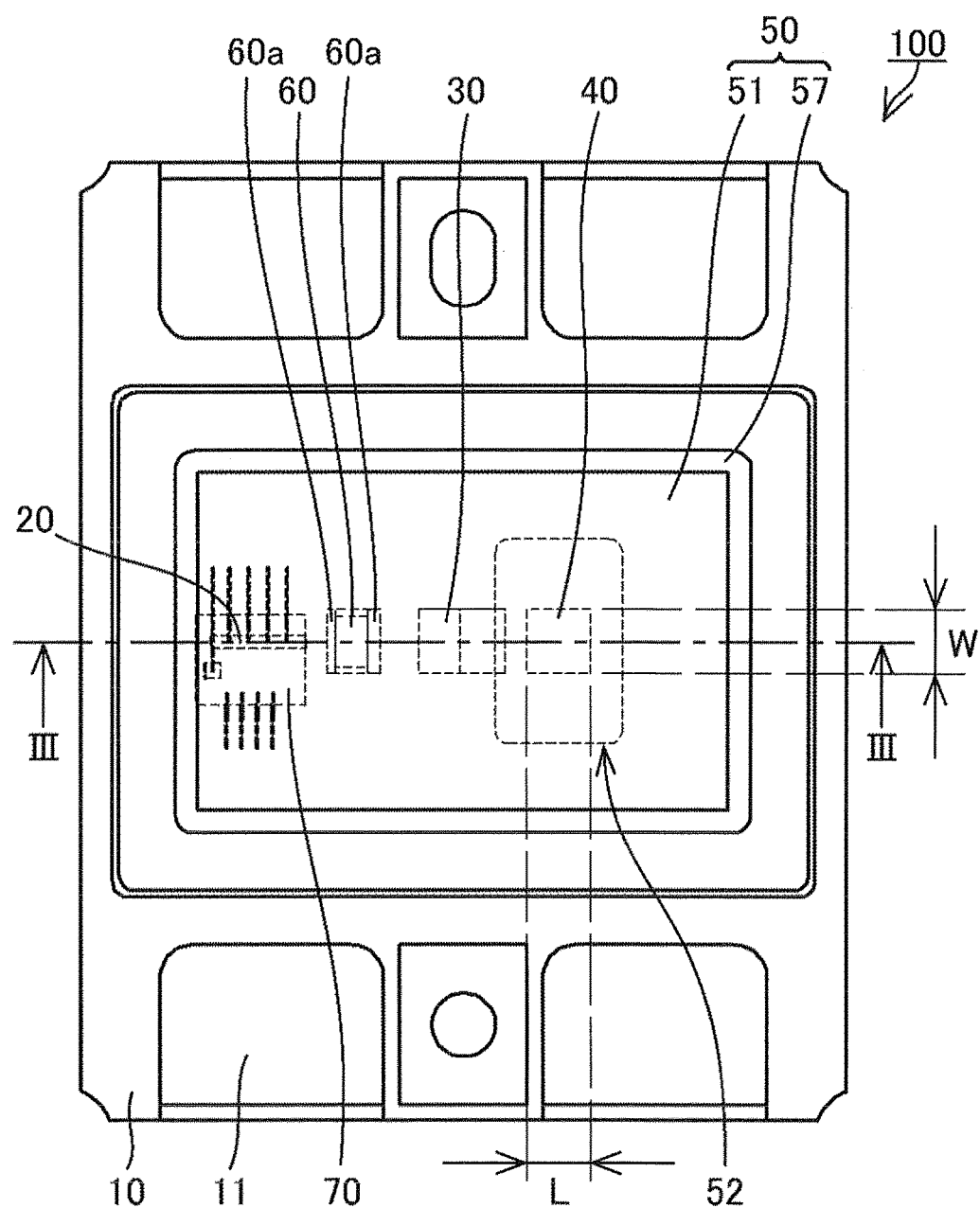
FIG. 2 is a schematic plan view of the light emitting device according to the embodiment of the invention.
Figure 3:
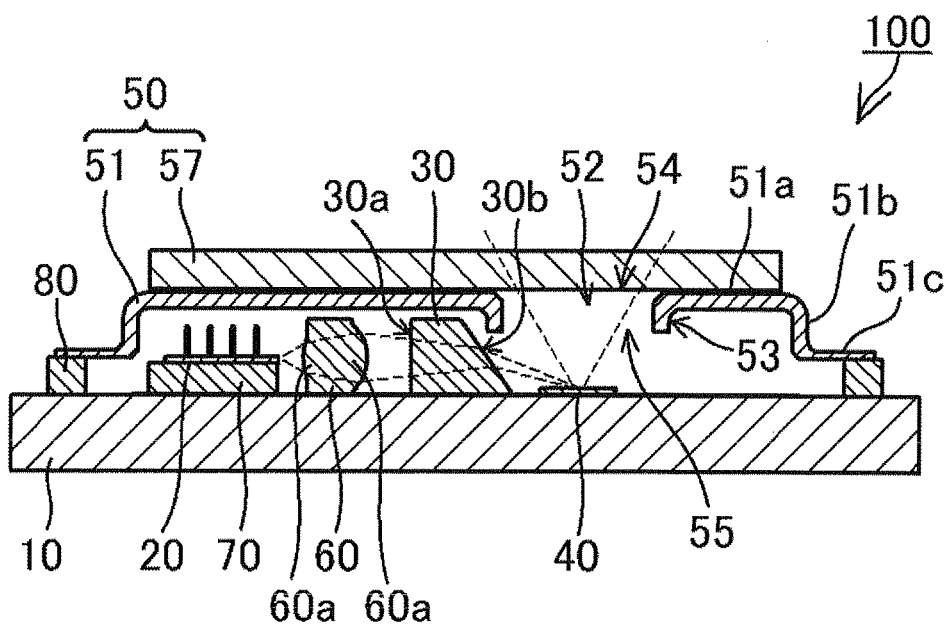
FIG. 3 is a schematic cross-sectional view of the light emitting device taken along line III-III in FIG. 2.

FIG. 1 is a schematic perspective view of the light emitting device 100 according to Embodiment 1. FIG. 2 is a schematic plan view of the light emitting device 100. FIG. 3 is a schematic cross-sectional view taken along line III-III in FIG. 2.

The light emitting device 100 includes: a laser element which is disposed on the upper face of a base 10 and laterally emits a laser beam; and a phosphor member 40 which is secured on the upper face of the base 10 and emits fluorescent light when irradiated by the laser beam. The light emitting device 100 also includes a first optical member 30 disposed on the upper face of the base 10. The first optical member 30 includes an entry-side lateral face 30a through which a laser beam enters and an exit-side lateral face 30b through which the laser beam exits, and can change the traveling direction of the laser beam passing through the first optical member 30 to a more downward direction. The light emitting device 100 also includes a cap 50 that covers the laser element 20, the phosphor member 40, and the first optical member 30. The cap 50 includes a light shielding member 51. The light shielding member 51 includes a through hole that penetrates the light shielding member 51 in a vertical direction at a location above the phosphor member 40, and a light transmissive member 57 that closes the through hole 52. A material adapted to transmit the light emitted by the phosphor member 40 is used for the light transmissive member 57.

In this embodiment, the laser element 20 is disposed on the upper face of the base 10 via a submount 70. The phosphor member 40 is positioned lower than the optical axis of the laser beam emitted from the laser element 20. The traveling direction of the laser beam laterally emitted from the laser element 20 is changed to a more downward direction by the first optical member 30, and the laser beam is obliquely incident on the upper face of the phosphor member 40. When excited by the entered laser beam, the phosphor member 40 emits light having a different wavelength than that of the laser beam. The wavelength-converted light is emitted primarily in an upward direction from the upper face of the phosphor member 40, and passes through the light transmissive member 57 disposed over the through hole 52 of the light shielding member 51 together with a portion of the reflected light which was reflected without exciting the phosphor member 40, and then ultimately is extracted from the light emitting device 100. In this manner, for example, white light can be extracted from the upper face of the light emitting device 100. Here, the upper face of the light emitting device 100 refers to the face from which light is extracted, in other words, the face on which the light transmissive member 57 is disposed. In the case where the light emitted by the light emitting device 100 is white light, the laser beam is, for example, blue light, and the wavelength converted light is, for example, yellow light.

The first optical member 30 can change the laser beam's traveling direction. The first optical member 30 allows the laser beam to obliquely enter the upper face of the phosphor member 40 even when the laser beam emitted from the laser element 20 is substantially in parallel to the upper face of the base 10, i.e., the laser beam is emitted in the direction to pass over the phosphor member 40. The phosphor member 40 emits light primarily at the upper face and the vicinity thereof, rather than inside. The light extraction face of the light emitting device 100 is located above the phosphor member 40. This can improve the light extraction efficiency of the light emitting device 100 thereby increasing the luminance compared to the case where the upper face of the phosphor member 40 subjected to laser beam irradiation and the light extraction face of the light emitting device 100 are not located on the same face side. The phosphor member 40 is excited by the laser beam primarily at the upper face and the vicinity thereof, hence, the thickness of the phosphor member 40 can be reduced as compared to the case where a laser beam enters from a lateral face of the phosphor member 40 and light is extracted from the upper face of the phosphor member. This allows for the generated heat to be effectively transferred to the base 10. This can also allow for miniaturization of the light emitting device 100.

The light shielding member 51 of the cap 50 is connected to the upper face of the base 10 via a metal part 80, sealing the laser element 20 and the first optical member 30 using the cap 50 and the base 10. The light shielding member 51 includes a plate-like portion 51a which includes a through hole 52 and a lateral portion 51b extending downward from the edges of the plate-like portion 51a, forming a cup shape. The light transmissive member 57 is attached on the upper face of the plate-like portion 51 at a positioned closing the through hole 52. The light shielding member 51 also has a collar 51c extending outwardly at substantially right angle from the bottom end of the lateral portion 51b, and the collar 51c is connected to the base 10.

The light shielding member 51 includes a protruded portion 53 on the lower face side of the plate-like portion 51a protruding to a level that is lower than the upper end of the first optical member 30 in such a manner as to face the exit-side lateral face 30b of the first optical member 30. The protruded portion 53 is provided along the through hole 52. Even if a portion of the laser beam entering the first optical member 30 is released as stray light from the upper face of the first optical member 30 in the direction towards the through hole 52, such stray light can be reflected by the protruded portion 53. This thus prevents or discourage such stray light from being directly exiting to the outside from the light emitting device.

Each member will be explained in detail below.

The light emitting device 100 is substantially rectangular in shape when viewed from the top. The size of the light emitting device 100 is preferably at least 5 mm per side, more preferably at least 10 mm per side, for heat dissipation purposes. For miniaturization purposes, the light emitting device 100 is preferably at most 25 mm per side, more preferably at most 20 mm per side. The upper face of the base 10 is preferably at least 1 mm per side, more preferably at least 2 mm, for disposing members such as a laser element 20. The thickness of the light emitting device 100 is preferably 6 mm at most. The thickness of the light emitting device 100 refers to the distance from the lower face of the base 10 to the upper face of the cap 50 (in this embodiment, the upper face of the light transmissive member 57).

Laser Element 20

Various types of laser elements of any given number can be used as the laser element 20. In the light emitting device 100, a GaN-based semiconductor laser element is used. The GaN-based semiconductor laser element can be made to have a light emission wavelength of, for example, 350 nm to 600 nm, preferably 430 nm to 460 nm. The output of the laser element 20 can be set to, for example, 2 W to 4 W.

The laser element 20 is preferably junction-down mounted on the upper face of the base 10. Here, junction-down mounting refers to mounting the principal face of the laser element 20 closer to its active layer on the mounting face of the base 10, for example, mounting the laser element 20 such that its active layer is positioned in the lower half of the thickness of the laser element 20. This allows for the heat generated by the laser element 20 to be effectively dissipated through the base 10.

In the light emitting device 100, a submount 70 is disposed on the upper face of the base 10, and the laser element 20 is disposed on the submount 70. This can distance the light emission face of the laser element 20 from the mounting face of the base 10 as compared to the case of directly disposing the laser element 20 on the upper face of the base 10. This, as a result, reduces the instances where the laser beam strikes the mounting face of the base 10, thereby making it easier to allow the laser beam to be obliquely incident on the upper face of the phosphor member 40. For the submount 70, for example, aluminum nitride, silicon carbide, or the like can be used. In the light emitting device 100, silicon carbide is used for the submount due to having high thermal conductivity. The thickness of the submount 70 can be, for example, 0.2 mm to 0.5 mm. The laser element 20 can be directly disposed on the mounting face of the base 10.

First Optical Member 30

The first optical member 30 is a member configured to change the laser beam's traveling direction. It is preferable for the first optical member 30 to be a prism including an entry-side lateral face 30a through which the laser beam enters, and an exit-side lateral face 30b through which the laser beam exits. A prism refers to a transparent polyhedron made of, for example, an inorganic-based material such as quartz, glass, sapphire, or the like. In the light emitting device 100, a polygonal prism glass is used as the first optical member 30 arranged sideways, mounting one face on the upper face of the base 10. The first optical member 30 does not contain phosphors or fillers. The first optical member 30 can change the traveling direction of light by refracting the light. The traveling direction of light can also be changed by allowing the first optical member 30 to reflect the light.

The first optical member 30 has a bottom face that is contiguous with the exit-side lateral face 30b. In the case where the first optical member 30 is disposed between the laser element 20 and the phosphor member 40 in a top view, it is preferable for the exit-side lateral face 30b and the bottom face of the first optical member 30 to form an acute angle. This angle is 55 degrees in the case of the light emitting device 100, but can be, for example, 50 to 70 degrees. In this manner, the laser beam entering the first optical member 30 can be refracted downward to exit the exit-side lateral face 30b towards the upper face of the phosphor member 40. This, moreover, allows the laser beam to enter the phosphor member 40 in a relatively short distance from the laser element 20. This can also attenuate the laser beam use efficiency decline. Furthermore, the effect of misalignment among the members on the laser beam can be reduced.

The first optical member 30 is preferably disposed in a position not overlapping the phosphor member 40 in a top view. This can reduce the possibility of a shadow to be generated by a portion of the upwardly emitted light from the phosphor member 40 striking the first optical member 30. The light emitted from the phosphor member 40 is less likely to strike the first optical member 30, thereby discouraging reduction in the light extraction efficiency.

In the case where the first optical member 30 is disposed between the laser element 20 and the phosphor member 40, it is preferable to apply an AR (anti-reflective) coating on the entry-side lateral face 30a and the exit-side lateral face 30b of the first optical member 30. This can increases the transmittance of the laser beam, thereby improving the efficiency of laser beam's entering and exiting the first optical member 30.

The upper face of the first optical member 30 is preferably flat such that it can be vacuum suctioned when mounting the first optical member 30 on the mounting face of the base 10. It is also preferable to form a light shielding film on the upper face of the first optical member 30. This can reduce the occurrence of stray light. A portion of the laser beam entering the first optical member 30 can occasionally exit the upper face of the first optical member 30 and extracted through the light transmissive member 57. This occurrence can be reduced by providing a light shielding film on the upper face. The bottom face of the first optical member 30 is preferably metallized with Au such that the bottom face and the Au metallized surface of the mounting face of the base 10 can be bonded using Au nanoparticles or a bonding member such as Au—Sn.

The entry-side lateral face 30a of the first optical member 30 is preferably substantially perpendicular to the optical axis of an entering laser beam. The first optical member 30 constructed as above can be manufactured in a simplified manner.

Second Optical Member 60

It is preferable to dispose a second optical member 60 between the laser element 20 and the first optical member 30. In the light emitting device 100, the second optical member 60 includes a rectangular parallelepiped frame portion and a lens portion 60a, and the lens portion 60a is shaped to protrude from the rectangular parallelepiped frame portion. The lens portion 60a is preferably configured to condense rays of a laser beam or convert them into parallel rays of light. In this manner, the rays of a laser beam emitted from the laser element 20 traveling in the direction to miss the first optical member 30 can be condensed or converted into parallel rays to become incident on the first optical member 30. As a result, use efficiency of the laser beam is less likely to be reduced. The thickness of the submount 70, if disposed under the laser element 20, can also be reduced. The thickness of the submount 70 can be reduced because the second optical member reduces the necessity to increase the height of the light emission point of the laser element 20 by increasing the thickness of the submount 70 to allow the rays of light traveling towards the bottom of the first optical member 30 to become incident on the first optical member 30. As a result, the heat generated by the laser element 20 can be efficiently dissipated through the base 10, and the thickness of the light emitting device 100 can also be reduced.

For the lens portion 60a, it is preferable to employ a cylindrical lens having a curved face on the side that the laser beam spreads. The cylindrical lens can condense the laser beam rays that spread in the vertical direction (that is, a direction perpendicular to the principal plane/mounting face of the laser element 20), while traveling. A laser beam emitted from a semiconductor laser element usually has the characteristic of traveling while spreading more in the vertical direction than in a lateral direction (that is, a direction perpendicular to the lateral direction and parallel to the principal plane/mounting face of the laser element 20). In this manner, the laser beam rays can be efficiently condensed to be incident on the first optical member 30. In the light emitting device 100, a cylindrical lens is disposed in the center of the rectangular parallelepiped frame portion. In this manner, the optical axis of the cylindrical lens can be easily aligned with the optical axis of the laser beam, in addition to facilitating the installation of the second optical member on the mounting face of the base 10.

The curved faces of the lens portion 60a may be spherical or aspherical. Moreover, the incidence face of the lens portion 60a may be a flat face. The curved faces of the lens portion 60a preferably have an AR coating.

The second optical member 60 preferably has a flat upper face so that it can be vacuum suctioned when being mounted on the mounting face of the base 10. Furthermore, the bottom face of the second optical member 60 is preferably metallized with Au such that the Au metallized surface of the mounting face of the base 10 and the bottom face of the second optical member 60 can be bonded using Au nanoparticles or a bonding member such as Au—Sn or the like.

Phosphor Member 40

The phosphor member 40 is a member that contains a phosphor. Examples of the phosphor member 40 include a member made by sintering a phosphor itself, or a member made by sintering a phosphor material to which a sintering aid is added.

For the phosphor member 40, those emitting fluorescent light that can produce white light when used in combination with the laser element 20 are preferable. This allows for the light emitting device to be used as a light source for vehicular headlights, lighting equipment, and the like. For example, in the case where the laser element 20 emits blue light, a phosphor that uses the light emitted by the laser element 20 as the excitation light to emit yellow light can be used. Examples of yellow light emitting phosphors include YAG-based phosphors. In the case where the laser element 20 emits light of a shorter wavelength than blue light (e.g., ultraviolet light), phosphors individually emitting blue, green, or red light can be used.

For the sintering aid, if used, silicon oxide, aluminum oxide, or the like can be used. Among all, aluminum oxide is particularly preferable. This is because aluminum oxide has a high melting point, and is highly heat resistant and light resistant.

For the light emitting device 100, a light diffusion treatment can be applied to the phosphor member 40. Light diffusion treatments include, for example, performing surface roughening on the upper face of the phosphor member 40, and disposing a scattering layer with a filler dispersed therein on the upper surface. Alternatively, a filler can be dispersed in the phosphor member 40. In this manner, the laser beam is scattered when irradiating the phosphor member 40, therefore the directionality of reflected light can be lowered as compared to the case where no diffusion treatment is applied to the phosphor member 40. As a result, the directionality of reflected light can be brought closer to that of the wavelength converted light. Specifically, for example, when the reflected light is blue light and the wavelength converted light is yellow light, bringing their directionality closer can reduce color non-uniformity in the white light extracted from the light emitting device.

The upper face of the phosphor member 40 is preferably positioned closer to the mounting surface of the base 10 than the light emission point of the laser element 20 in the height direction. This makes it easy to allow a laser beam to obliquely enter the upper face of the phosphor member 40. The thickness of the phosphor member 40 is preferably 0.05 mm to 0.5 mm, more preferably 0.1 mm to 0.2 mm.

The shape of the phosphor member 40 can be, for example, a rectangular parallelepiped, preferably 1 mm or less in width (i.e., W in FIG. 2) and 1 mm or less in length (i.e., L in FIG. 2), and more preferably 0.5 mm or less in width and 0.5 mm or less in length. This range allows for the light emitting device 100 to achieve higher luminance with a smaller light emission area of the phosphor member 40. Setting the width of the phosphor member 40 to at least 0.1 mm and the length thereof to at least 0.1 mm can reduce the likelihood of the laser beam missing the phosphor member 40 even if the position of the phosphor member 40 on the mounting surface was shifted. This can reduce the likelihood of the laser light being extracted directly from the light emitting device 100 without traveling through the phosphor member 40. In the light emitting device 100, the phosphor member 40 is substantially a square when viewed from the top, but can be any other shape.

Base 10

The base 10 can be formed with, for example, a ceramic and/or metal material, such as aluminum nitride or aluminum oxide. Forming the base 10 primarily with aluminum nitride is preferable as its thermal conductivity and corrosion resistance can be improved. If the base 10 is primarily formed of a ceramic layer, the later described internal wiring members to be electrically connected to external electrodes can be embedded in the base 10. Forming internal wiring members within the base 10 allows for the electrical connection between the inside and the outside of the sealed space, thereby eliminating the necessity for lead terminals that penetrate the base 10 and easily achieving a hermetic seal. The internal wiring members can be formed primarily with, for example, tungsten or molybdenum.

The upper face of the base 10 is preferably flat. The upper face of the base 10 is also preferable to be substantially parallel to the lower face of the base 10. This allows for the installation of a heatsink at the bottom face of the base 10, thereby achieving more uniform heat dissipation at higher efficiency for each member disposed on the upper face of the base 10.

The base 10 can include external electrodes 11 on the upper face side for electrical connection with the outside. The external electrodes 11 are formed on the outer side of the area where a cap 50 is connected on the upper face of the base 10. The external electrodes 11 are electrically connected to the inner side of the area where the cap 50 is connected using the internal wiring members. For the external electrodes 11, for example, a metal film can be used. The metal film can be formed by containing, for example, Au, Ag, Al, Ti, Pt, Ni, or Pd. For the metal film for the external electrodes 11, the same material as that disposed as a metal film on the mounting face of the base 10 can be used.

Metal Part 80

On the upper face of the base 10, a metal part 80 can be disposed to be connected to a cap 50. The metal part 80 can have, for example, iron or Kovar as a main component, and Ni plating or Au plating may be applied to the surface. The metal part 80 is secured on the upper face of the base 10 using an Ag brazing alloy or the like. In the case where the base 10 is constructed primarily with a ceramic, disposing the metal part 80 on the upper face of the base 10 allows for the cap 50 to be secured to the base 10 by welding such as seam welding, thereby easily achieving a hermetic seal for the light emitting device 100.

Cap 50

The cap 50 includes a light shielding member 51 and a light transmissive member 57 and is used to seal the laser element 20. The seal may be of the level that does not allow penetration of moisture or gas beyond a predetermined amount. A hermetic seal is preferable. In the case where the laser element 20 is a GaN-based semiconductor laser element, for example, the light density is particularly high at the light emission face of the laser element 20 and the vicinity thereof, readily collecting dust such as organic substances. A hermetic seal can not only prevent or discourage this, but also reduce the impact of external moisture on the phosphor member 40. The cap 50 is constructed with a cup-shaped light shielding member 51 having a through hole 52, and a light transmissive member 57 closing the through hole 52.

Light Shielding Member 51

The light shielding member 51 has a cup shape which is open towards the base 10. The light shielding member 51 can be connected to the base 10 by welding, such as seam welding. The light shielding member 51 and the base 10 can be securely welded together, therefore the light emitting device 100 can have the light shielding member 51 that is less susceptible to separation from the base 10, even when the light emitting device 100 is subjected to shock, such as vibration.

The through hole 52 is created in the plate-like portion 51a of the light shielding member 51. The through hole 52 is a hole through which light emitted by the phosphor member 40 passes. Here, a rectangular-shaped through hole 52 when viewing the cap 50 from the top is shown as an example, but the shape is not limited to this. For example, the shape can be a square, circle, ellipse, diamond, or polygon suitably selected for the application.

The level of safety of the light emitting device 100 can be increased because the light shielding member 51 having light shielding properties can reduce the likelihood of allowing the laser light to be released directly from the light emitting device 100 without striking the phosphor member 40. For the material used for the light shielding member 51, metals containing Kovar, stainless steel, or the like can be used, and Ni plating or Au plating may be applied on the surface. The light shielding member 51 can be connected to the base 10 by welding, such as seam welding. The light shielding member 51 and the base 10 can be securely welded together, therefore the light emitting device 100 can have the light shielding member 51 that is less susceptible to separation from the base 10, even when the light emitting device 100 is subjected to shock, such as vibration.

Figure 4A:
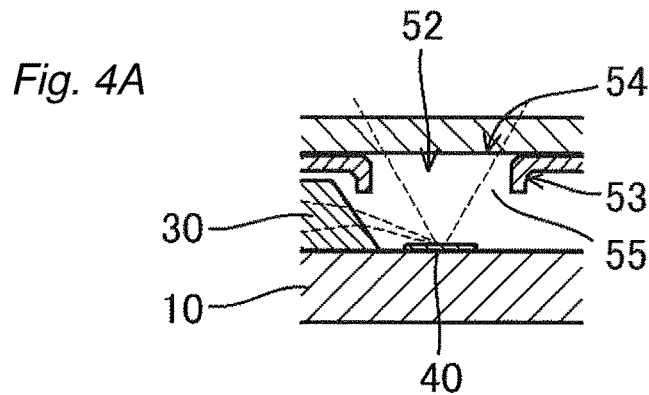
FIGS. 4A-4D show schematic cross-sectional views of examples of a protruded portion.

FIG. 4A is a schematic cross-sectional view showing an example of the protruded portion 53. The protruded portion 53 is formed along the perimeter of the through hole 52 so as to downward extend part of the plate-like portion 51a. In the light emitting device 100, the protruded portion is a tubular in shape, and includes an upper opening 54 corresponding to the upper end of the through hole 52 and a lower opening 55 corresponding to the lower end of the through hole 52. The phosphor member 40 is preferably positioned on the inner side of the lower opening 55 when viewing the cap 50 from the top. This allows for the light emitted from the phosphor member 40 to be efficiently extracted from the light emitting device.

The protruded portion 53 preferably extends to a position that is lower than the upper end of the first optical member 30 so as to face the exit-side lateral face of the first optical member 30. The distance between the lower face (i.e., lower end) of the protruded portion 53 and the upper face of the phosphor member 40 is preferably 5 mm at most. This can improve the light extraction efficiency of the light emitting device 100. In other words, the light from the phosphor member 40 spreads in proportion to the distance from the phosphor member 40, therefore bringing the lower face of the protruded portion 53 and the upper face of the phosphor member 40 close together can reduce the likelihood of the light from the phosphor member 40 striking the area other than the through hole 52, thereby improving the light extraction efficiency.

Figure 4B:
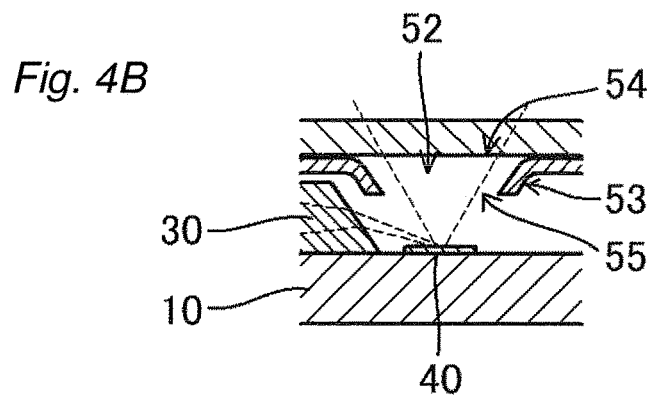

FIG. 4B is a schematic cross-sectional view of a variation of the protruded portion 53. The protruded portion 53 is formed so that the width of the upper opening 54 is larger than the width of the lower opening 55. In other words, the inner wall of the through hole 52 is inclined with the opening becoming larger from the lower side to the upper side. Returning light of the light entering the through hole 52 can be reflected by the inner wall face of the through hole 52 to be efficiently extracted.

Figure 4C:
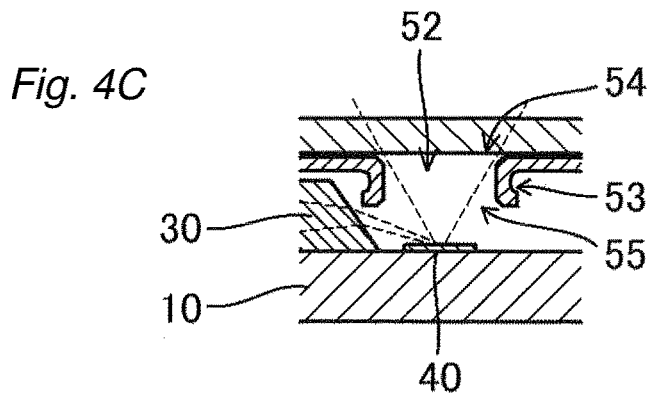

FIG. 4C is a schematic cross-sectional view of another variation of the protruded portion 53. In FIG. 4C, the lower end of the protruded portion 53 is bent outwardly (away from the central axis of the through hole 52). Even if burrs are formed at the lower end of the protruded portion 53 during the processing of the cap, this can prevent or discourage the burrs from blocking the light.

Figure 4D:
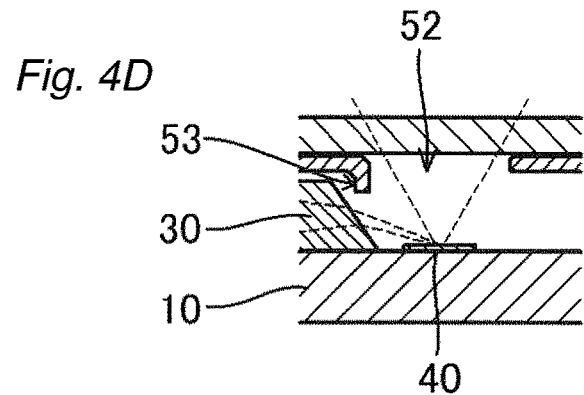

FIG. 4D is a schematic cross-sectional view of yet another variation of the protruded portion 53. In FIG. 4D, the protruded portion 53 is only formed at the location facing the first optical member 30 between the first optical member 30 and the through hole 52 when viewing the cap 50 from the top. Even if a portion of the laser beam entering the first optical member 30 is released as stray light from the upper face of the first optical member 30 in the direction towards the through hole 52, such stray light can be reflected by the protruded portion 53 in this configuration also, thereby preventing or discouraging the light from being released directly from the light emitting device.

Light Transmissive Member 57

The light transmissive member 57 transmits the light from the phosphor member 40. The light transmissive member 57 is bonded on the upper face of the plate-like portion 51a of the light shielding member 51 in such a manner as to close the through hole 52 of the light shielding member 51. A material of the light transmissive member 57 can be preferably that having a similar linear expansion coefficient to a material of the light shielding member 51 in order to improve the airtightness achieved with the base 10. Specifically, glass can be used as the light transmissive member 57. In the light emitting device 100, borosilicate glass is used as the light transmissive member 57. It is also preferable to apply an AR coating on both faces of the light transmissive member 57. This can improve the transmittance of the light from the phosphor member 40, thereby moderating the light extraction efficiency decline. In the light emitting device 100, the light transmissive member 57 does not contain phosphors. The light shielding member 51 and the light transmissive member 57 can be bonded by using, for example, low melting point glass.

Embodiment 2

Figure 5:
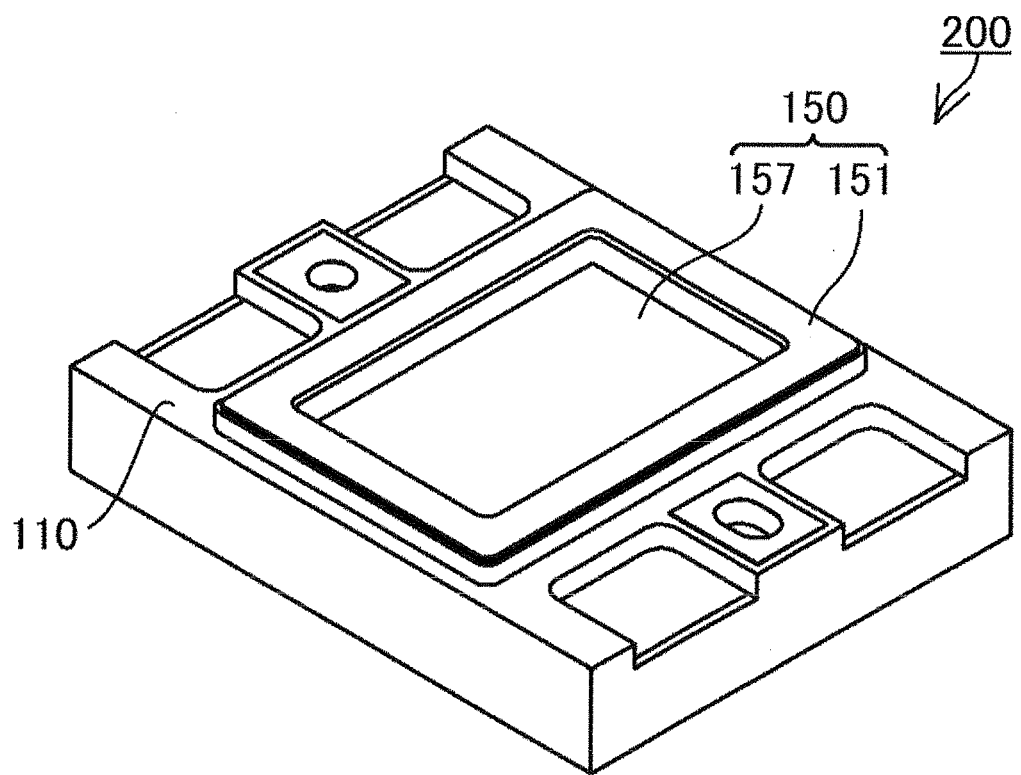
FIG. 5 is a schematic perspective view of the light emitting device according to one embodiment of the invention.
Figure 6:
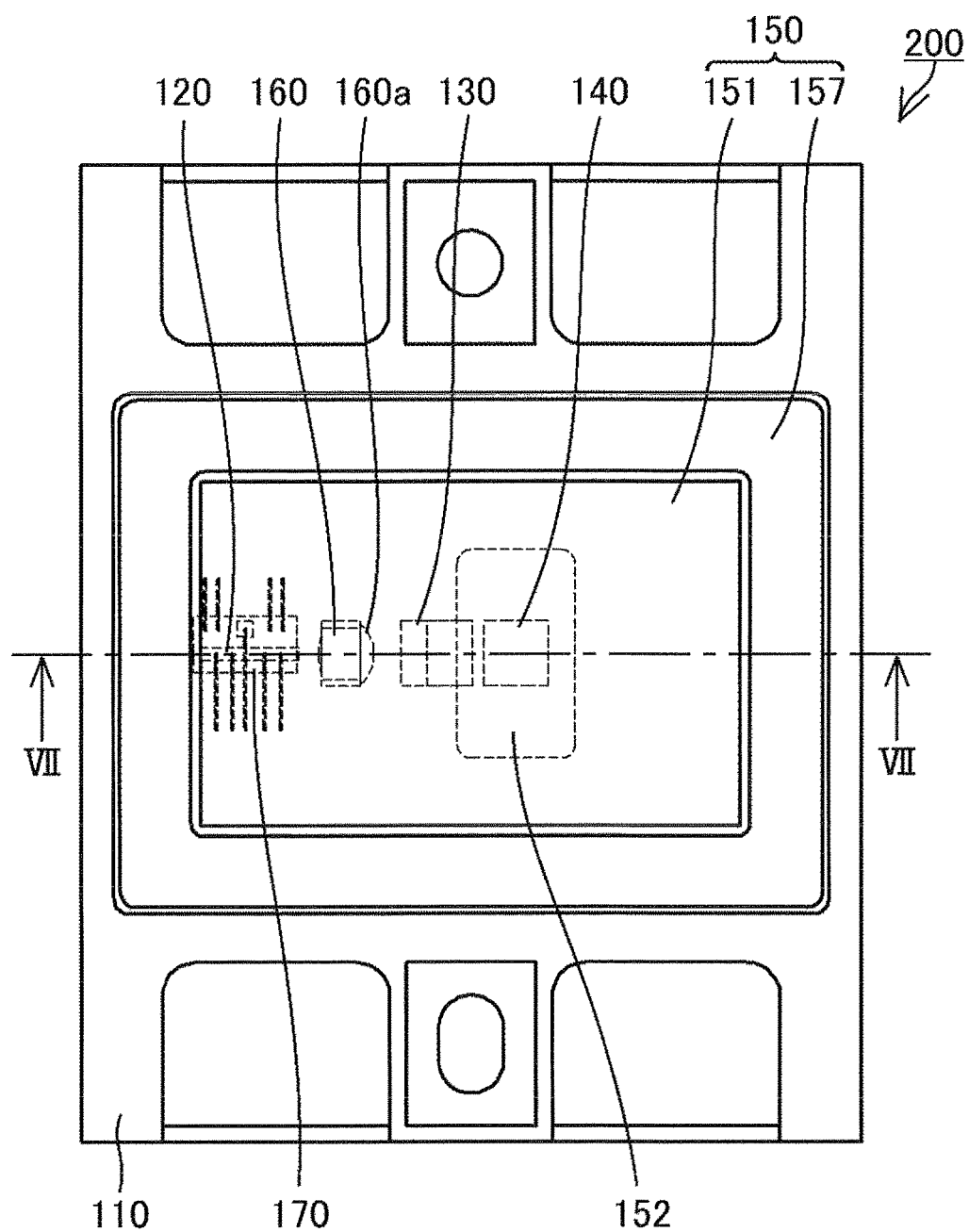
FIG. 6 is a schematic plan view of the light emitting device according to the embodiment of the invention.
Figure 7:
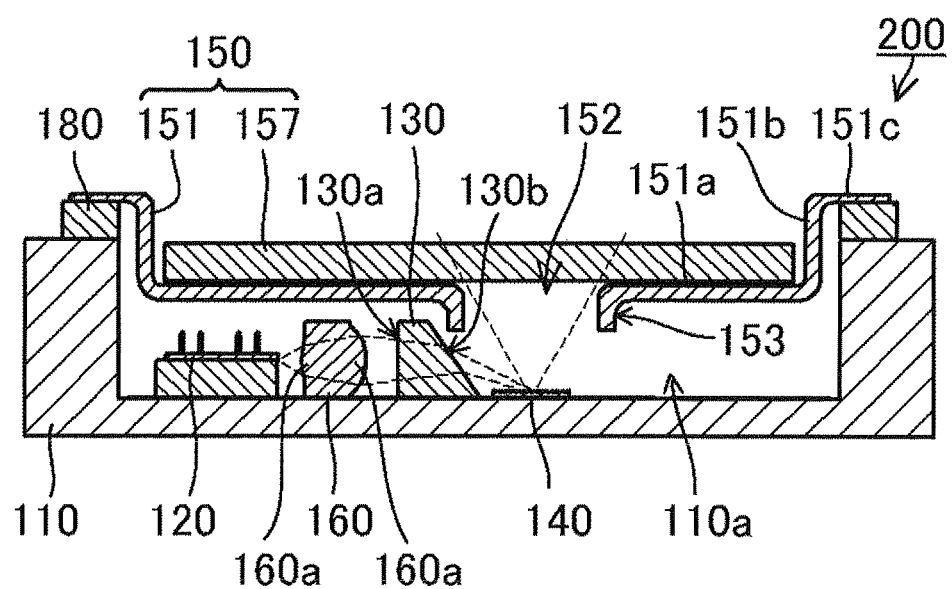
FIG. 7 is a schematic cross-sectional view of the light emitting device taken along line VII-VII in FIG. 6.

FIG. 5 is a schematic perspective view of the light emitting device 200 according to Embodiment 2. FIG. 6 is a schematic plan view of the light emitting device 200. FIG. 7 is a schematic cross-sectional view taken along line VII-VII in FIG. 6.

In the light emitting device 200, the base 110 has a recess 110a that is open at the top. In this case, since the laser element 120 and so on are mounted on the bottom face of the recess 110a, the bottom face of the recess 110a serves as the mounting surface. In view of heat dissipation efficiency, the recess 110a has a flat bottom face. The bottom face of the recess 110a is substantially parallel to the lower face of the base 110.

The cap 150 is connected to the upper face of the base 110 in such a manner as to close the opening of the recess 110a of the base 110, to seal the laser element 120, the phosphor member 140, and the first optical member 130 in the recess 110a. The cap 150 is bonded to the base 110 via the metal part 180 in such a manner as to hermetically seal the base 110.

The light shielding member 151 of the cap 150 has a recess made of a plate-like portion 151a having a through hole 152, and a lateral portion 151b extending upwardly substantially from the end of the plate-like portion 151a. The light shielding member 151 also has a collar 151c extending outwardly substantially at right angle from the upper end of the lateral portion 151b, and the collar 151c is bonded to the base 110 via the metal part 180. The light transmissive member 157 is disposed in the recess of the light shielding member 151. This makes it difficult for the members disposed outside the light emitting device 100 to come into contact with the light transmissive member 157, thereby reducing the likelihood of damaging the light transmissive member 157.

The light shielding member 151 has a protruded portion 153 on the lower face side of the plate-like portion 151a protruding to a position that is lower than the upper end of the first optical member 130 in such a manner as to face the exit-side lateral face 130b of the first optical member 130. The protruded portion 153 is disposed along the through hole 152. Even if a portion of the laser beam entering the first optical member 130 is released as stray light from the upper face of the first optical member 130 in the direction towards the through hole 152, such stray light can be reflected by the protruded portion 153 in this configuration, thereby preventing or discouraging the light from being directly released from the light emitting device.

What is claimed is:

1. A light emitting device comprising:
   a base;
   a laser element disposed on an upper face of the base and adapted to laterally emit a laser beam along the upper face of the base;
   a phosphor member disposed on the upper face of the base and adapted to emit fluorescent light when irradiated with the laser beam;
   a first optical member disposed between the laser element and the phosphor member on the upper face of the base, the first optical member comprising an entry-side lateral face through which the laser beam enters during use and an exit-side lateral face through which the laser beam exits during use, and the first optical member being configured to change a traveling direction of the laser beam such that the laser beam is irradiated to the phosphor member; and
   a cap covering the laser element, the first optical member, and the phosphor member, the cap comprising:
      a light shielding member having a through hole at a position opposite to the phosphor member such that light from the phosphor member passes through the through hole, and
      a light transmissive member covering the through hole, wherein the light shielding member includes a protruded portion extending from a circumference of the through hole toward the upper face of the base so as to face the exit-side lateral face of the first optical member.

2. The light emitting device according to claim 1, wherein the protruded portion has a tubular shape, and includes an upper opening corresponding to an upper end of the through hole and a lower opening corresponding to a lower end of the through hole.

3. The light emitting device according to claim 2, wherein the phosphor member is disposed inward of the lower opening when viewed from above.

4. The light emitting device according to claim 1, wherein the through hole includes an inner wall that is inclined such that the through hole widens from a lower side to an upper side thereof.

5. The light emitting device according to claim 1 further comprising:
   a second optical member disposed between the laser element and the first optical member, the second optical member being configured to condense rays of the laser beam or convert the rays of the laser beam into parallel rays.

6. The light emitting device according to claim 1, wherein:
   the first optical member comprises a bottom face contiguous with the exit-side lateral face, and
   the exit-side lateral face and the bottom face of the first optical member form an acute angle.

* * * * *